United States Patent
Egashira (10) Patent No.: US 6,593,627 B2
(45) Date of Patent: Jul. 15, 2003

(54) SOI SEMICONDUCTOR WAFER HAVING DIFFERENT THICKNESS ACTIVE LAYERS AND SEMICONDUCTOR DEVICE FORMED THEREIN

(75) Inventor: Katsumi Egashira, Tokyo (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 10/108,648

(22) Filed: Mar. 29, 2002

(65) Prior Publication Data

US 2002/0142507 A1 Oct. 3, 2002

(30) Foreign Application Priority Data

Mar. 30, 2001 (JP) .......................... 2001-101514

(51) Int. Cl.[7] .................. H01L 27/01; H01L 27/12; H01L 31/0392; H01L 29/76; H01L 29/94
(52) U.S. Cl. ................ 257/350; 257/355; 257/378; 257/577
(58) Field of Search ................ 257/350, 378, 257/355, 577

(56) References Cited

U.S. PATENT DOCUMENTS 5,102,809 A * 4/1992 Eklund et al.
5,475,256 A * 12/1995 Sawada et al. ............. 257/577
5,708,287 A * 1/1998 Nakagawa et al. ......... 257/350
5,740,099 A * 4/1998 Tanigawa ................... 365/51
5,828,112 A * 10/1998 Yamaguchi ................. 257/378

FOREIGN PATENT DOCUMENTS

JP 11-163125 6/1999

* cited by examiner

Primary Examiner—Ngân V. Ngô
(74) Attorney, Agent, or Firm—Oblon, Spivak, McClelland, Maier & Neustadt, P.C.

(57) ABSTRACT

A semiconductor wafer has a first element forming section, a second element forming section adjoining the first element forming section, and a third element forming section adjoining the second element forming section. The first element forming section has a first supporting substrate, a first buried insulating film formed on the first supporting substrate, and a first active layer formed on the first buried insulating film. The second element forming section has a second supporting substrate, a second buried insulating film formed on the second supporting substrate, and a second active layer formed on the second buried insulating film. The second active layer has a thickness being different from a thickness of the first active layer. The third element forming section has a third active layer.

8 Claims, 7 Drawing Sheets

SOI SEMICONDUCTOR WAFER HAVING DIFFERENT THICKNESS ACTIVE LAYERS AND SEMICONDUCTOR DEVICE FORMED THEREIN

CROSS REFERENCE TO RELATED APPLICATIONS

This application is based upon and claims the benefit of priority from the prior Japanese Patent Applications No. P2001-101514 filed on Mar. 30, 2001, the entire contents of which are incorporated herein by reference.

BACKGROUND OF THE INVENTION

1. Field of the Invention

The present invention relates to a semiconductor wafer having a buried insulating film on which an active layer is formed and a semiconductor device formed from the wafer. In particular, the present invention relates to a SOI structure containing active layers and a bulk section, the active layers having different thickness depending on the purposes of semiconductor elements formed therein, the bulk section having a semiconductor element without a buried insulating film.

2. Description of the Related Art

Rapidly spreading portable information devices require high-speed, low-power-consumption semiconductor devices. Such semiconductor devices require an improved device structure as well as an improved system design and circuit design.

A semiconductor device formed on a bulk silicon substrate may have reduced power consumption if load capacity and supply voltage thereof are decreased. The bulk silicon substrate, however, deteriorates the operation speed of the device. High expectation is held regarding silicon on insulator (SOI) substrates, for forming semiconductor devices which simultaneously realize high-speed operation and low power consumption. A semiconductor device formed on an SOI substrate may simultaneously realize high-speed operation and low power consumption if parasitic capacitance between the device and the substrate or between wiring of the device and the substrate is reduced.

The SOI substrate is identified by an SOI structure encompassing an insulating layer and a monocrystalline silicon layer on the insulating layer. The SOI structure is capable of reducing junction capacitance and substrate bias effect without deteriorating operation speed. The SOI structure allows a supply voltage to be decreased to realize low power consumption. An SOI wafer is a wafer having the SOI structure. The SOI wafer is formed by a silicon wafer direct bonding (SDB) method or a separation by implanted oxygen (SIMOX) method. The SDB method bonds silicon wafers to each other with an oxide film interposed between them. The SIMOX method implants oxygen ions into a silicon wafer and carries out heat treatment to form a buried oxide film in the silicon wafer.

Semiconductor elements formed on the SOI wafer or SOI substrate are called SOI elements and are formed in the monocrystalline silicon active layer on the buried oxide film of the SOI substrate. The thickness of the active layer is dependent on the purpose of the SOI elements formed therein. If the SOI elements are CMOS elements operating at high speed and low power consumption, the thickness of the active layer is about 50 to 100 nm. If the SOI elements are high breakdown voltage elements, the thickness of the active layer is several micrometers.

A protective diode is a semiconductor element provided to a semiconductor device, to guide an over current from a connection pin to a substrate and to the outside of the semiconductor device, to thereby protecting an internal circuit of the semiconductor device. As such a protective diode, the buried oxide film in the SOI substrate is useless or obstructive and a bulk silicon substrate is more preferable than the SOI substrate.

In the SOI wafer or SOI substrate, the buried oxide film is uniformly formed to entirely cover the wafer. Namely, the buried oxide film has a uniform depth measured from the surface of the wafer, and the active layer has a uniform thickness over the wafer. It is difficult, therefore, to form SOI elements of different purposes on the same SOI substrate.

SUMMARY OF THE INVENTION

According to a first aspect of the present invention, a semiconductor wafer has a first element forming section, a second element forming section adjoining the first element forming section, and a third element forming section adjoining the second element forming section. The first element forming section has a first supporting substrate, a first buried insulating film formed on the first supporting substrate, and a first active layer formed on the first buried insulating film. The second element forming section has a second supporting substrate, a second buried insulating film formed on the second supporting substrate, and a second active layer formed on the second buried insulating film. The second active layer has a thickness being different from a thickness of the first active layer. The third element forming section has a third active layer.

According to a second aspect of the present invention, a semiconductor device has a first element forming section, a second element forming section adjoining the first element forming section, a third element forming section adjoining the second element forming section, and first, second and third semiconductor elements merged in the first, second and third element forming sections, respectively. The first element forming section has a first supporting substrate, a first buried insulating film formed on the first supporting substrate, and a first active layer formed on the first buried insulating film. The second element forming section has a second supporting substrate, a second buried insulating film formed on the second supporting substrate, and a second active layer formed on the second buried insulating film. The third element forming section has a third active layer. The second active layer has a thickness being different from a thickness of the first active layer.

According to a third aspect of the present invention, a method of manufacturing a semiconductor wafer includes preparing a monocrystalline silicon substrate, forming, on the substrate, a first ion-implantation protection film having an opening corresponding to a first element forming section of the substrate, selectively implanting oxygen ions through the opening into the first element forming section to a first depth, forming, on the substrate, a second ion-implantation protection film having an opening corresponding to a second element forming section of the substrate, selectively implanting oxygen ions through the opening into the second element forming section to a second depth being different from the first depth, heating the substrate to react the implanted oxygen atoms with silicon atoms.

According to a fourth aspect of the present invention, a method of manufacturing a semiconductor device includes preparing a semiconductor substrate, forming, on the substrate, a first ion-implantation mask having a first opening defining a first element forming section of the substrate, selectively implanting oxygen ions through the first opening into the first element forming section with a first projected range from a top surface of the substrate, forming, on the substrate, a second ion-implantation mask having a second opening defining a second element forming section of the substrate, selectively implanting oxygen ions through the second opening into the second element forming section with a second projected range from the top surface being different from the first projected range, heating the substrate to react the implanted oxygen atoms with silicon atoms so as to form a first buried insulating film under the first element forming section and a second buried insulating film under the second element forming section, and forming first, second and third semiconductor elements in the first and second element forming sections and a third element forming section, respectively. The third element forming section is defined as a part of the substrate neighboring to the second element forming section.

DETAILED DESCRIPTION OF EMBODIMENTS

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

(First embodiment)

Figure 1:
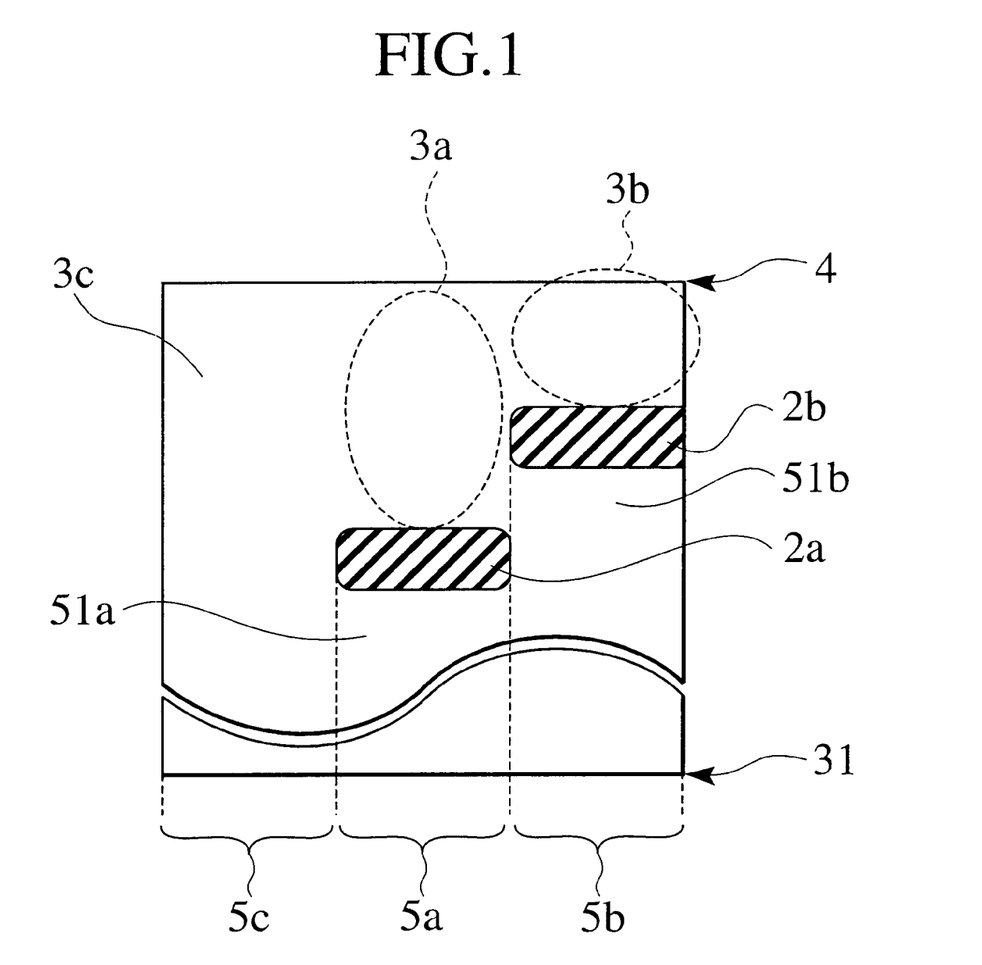
FIG. 1 is a sectional view showing a part of a top surface of a semiconductor wafer where semiconductor elements are formed according to a first embodiment of the present invention.

In FIG. 1, a semiconductor wafer or a semiconductor substrate has a first element forming section 5a, a second element forming section 5b adjoining the first element forming section 5a, and a third element forming section 5c adjoining the second element forming section 5b. The first element forming section 5a has a first supporting substrate 51a, a first buried insulating film 2a formed on a top surface of the first supporting substrate 51a, and a first active layer 3a formed on a top surface of the first buried insulating film 2a. The second element forming section 5b has a second supporting substrate 51b, a second buried insulating film 2b formed on a top surface of the second supporting substrate 51b, and a second active layer 3b formed on a top surface of the second buried insulating film 2b. The second active layer 3b has a thickness being different from a thickness of the first active layer 3a. The third element forming section 5c has a third active layer 3c.

The semiconductor wafer is identified by a flat top surface 4 and a bottom surface 31. The first active layer 3a extends between the top surface of the first buried insulating films 2a and the flat top surface 4. The second active layer 3b extends between the top surface of the second buried insulating films 2b and the flat top surface 4. The first and second buried insulating films 2a and 2b are formed at a different depth measured from the flat top surface 4. The third active layer 3c is formed between the flat top surface 4 and a bottom surface 31. The first, second and third active layers 3a to 3c are made of monocrystalline silicon.

The first buried insulating film 2a is buried in the first element forming section 5a at a relatively deep depth. The second buried insulating film 2b is buried in the second element forming section 5b at a depth shallower than the depth of the first buried insulating film 2a. The third element forming section 5c has no buried insulating film. The first and second buried insulating films 2a and 2b are each made of a silicon oxide ($SiO_2$) film and have substantially the same thickness.

In the first, second and third active layers 3a to 3c, the first, second and third semiconductor elements to form the integrated circuit are formed, respectively. The first, second and third semiconductor elements have different purposes. Namely, the presence and thickness of active layers 3a to 3c are determined according to a layout plan of the integrated circuit.

The following explanation of the first embodiment is made in conditions where the first and second buried insulating films 2a and 2b are formed in the semiconductor wafer and the first, second and third semiconductor elements have not yet been formed. In the first element forming section 5a, the thick active layer 3a is formed on the first buried insulating film 2a. In the second element forming section 5b, the thin active layer 3b is formed on the second buried insulating film 2b.

The semiconductor wafer has a disk shape. An orientation flat (not shown) indicating the Miller indices of a silicon crystal structure is formed on the periphery of the semiconductor wafer.

FIG. 1 shows only part of the semiconductor wafer where the first to third element forming sections 5a to 5c are formed. Other parts of the semiconductor wafer not shown in FIG. 1 may have element forming sections with or without buried insulating films. Namely, the semiconductor wafer according to the first embodiment has at least the first and second element forming sections (5a, 5b) where buried insulating films (2a, 2b) of different depths are formed respectively.

The semiconductor wafer according to the first embodiment has two topologies of buried insulating films (2a, 2b) of different depths. This does not limit the present invention. Semiconductor wafers having three or more topologies of buried insulating films of different depths are possible according to the first embodiment.

The first embodiment is applicable to forming a semiconductor wafer for a semiconductor integrated circuit having element isolation regions made of p-n junctions or insulators. In this case, the first and second buried insulating films (2a, 2b) according to the first embodiment may or may not overlap the element isolation regions.

A method of manufacturing the semiconductor wafer of FIG. 1 will be explained with reference to FIGS. 2A and 2B.

(1) A monocrystalline silicon rod is produced by, for example, Czochralski (CZ) method or floating zone (FZ) method. At this time, an n- or p-type dopant may be doped in the monocrystalline silicon.

(2) A notch or an orientation flat (OF) is formed on the rod. The rod is sliced into disks. Each disk is lapped, polished, tested for defects, and provided as a semiconductor wafer made of a substrate 1 having a flat top surface 4.

Figure 2A:
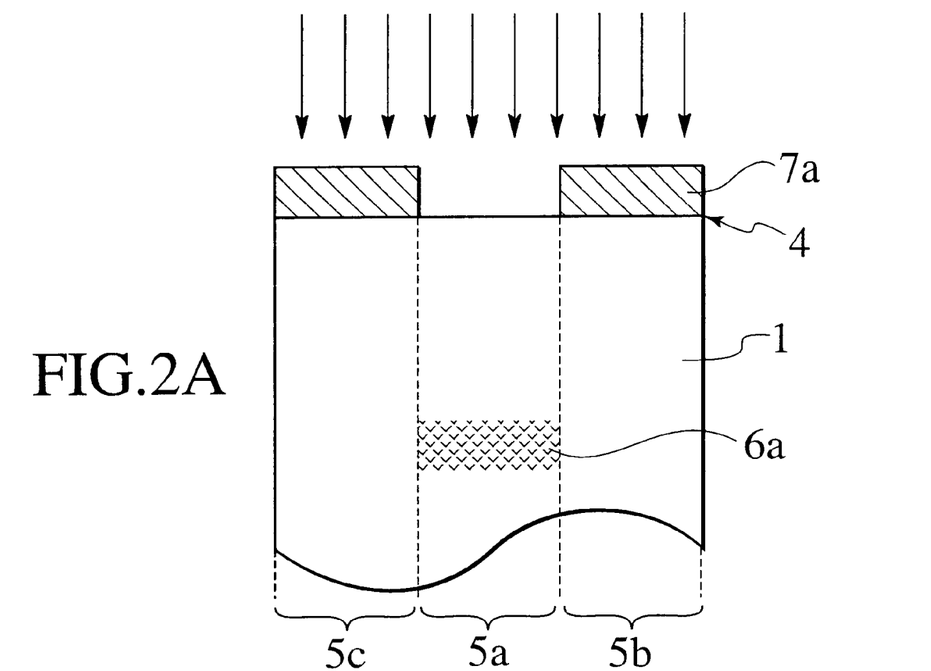
FIGS. 2A and 2B are sectional views corresponding to FIG. 1 and showing a method of manufacturing the semiconductor wafer of FIG. 1.

(3) In FIG. 2A, a first mask 7a is formed on the flat top surface 4 of the substrate 1. The first mask 7a has an opening corresponding to a first element forming section 5a. The first mask 7a serves as an ion-implantation protection film when oxygen ions are implanted into the substrate 1. The first mask 7a may be made of a photoresist film, an amorphous silicon film, an insulating film, or a metal film. The same is applicable to a second mask, to be explained later.

The first mask 7a is used to selectively implant oxygen ions into the first element forming section 5a, to a relatively deep depth. For example, the depth is about 200 nm from the flat top surface 4, and oxygen ions to be implanted are accelerated at about 200 keV. It is preferable that a dose of oxygen ions is in a range of about $4 \times 17^{17}$ to $1 \times 10^{18}$ cm$^{-2}$ and that the substrate 1 is heated to about 400 to 600° C. during the oxygen ion implantation. The quantity of oxygen ions and the temperature of the substrate 1 mentioned above are appropriate to minimize damage to the substrate 1 during the ion implantation. The implanted oxygen atoms 6a remain in an area forming the first buried insulating film 2a of FIG. 1. After the completion of ion implantation, the first mask 7a is removed.

Figure 2B:
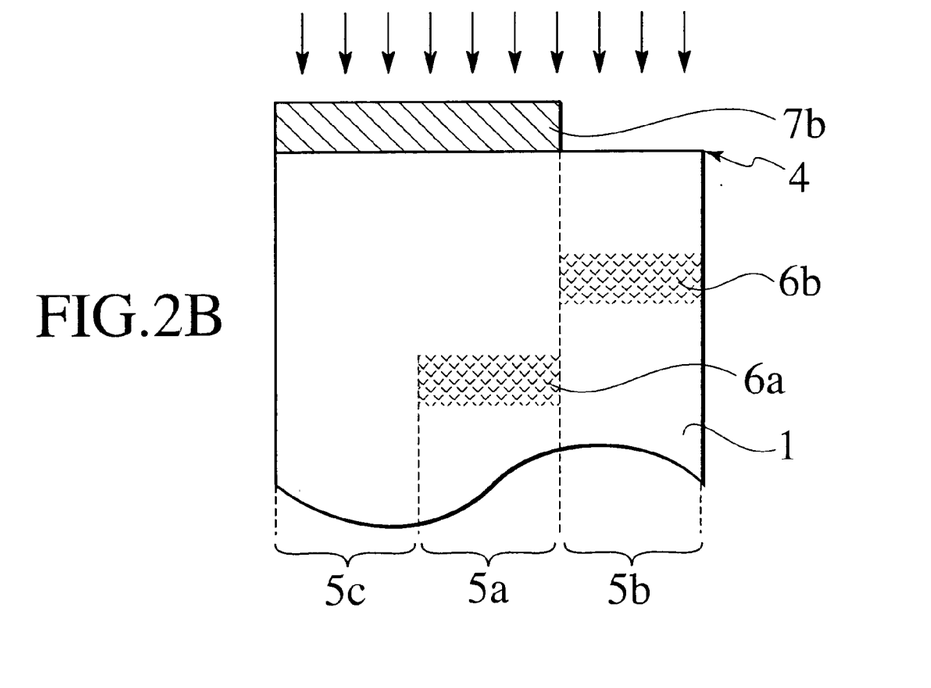

(4) In FIG. 2B, the second mask 7b is formed on the flat top surface 4 of the substrate 1, as in the first mask 7a. The second mask 7b has an opening corresponding to a second element forming section 5b. The second mask 7b is used to selectively implant oxygen ions in the second element forming section 5b to a depth that is shallower than the depth of the oxygen atoms 6a. For example, oxygen ions are accelerated at about 100 keV and are implanted to a depth of about 100 nm. It is preferable that the quantity of oxygen ions and the temperature of the substrate 1 are set as described above to minimize damage to the substrate 1. The implanted oxygen atoms 6b remain in an area forming the second buried insulating film 2b of FIG. 1. After the completion of the ion implantation, the second mask 7b is removed.

In this way, the ion implanting masks are used to selectively implant ions in the first and second element forming sections 5a and 5b at different ion implanting energy levels (acceleration voltages). The third element forming section 5c is a bulk silicon section, and therefore, no oxygen ions are implanted therein.

(5) The substrate 1 is set in a heat-treatment furnace to carry out a heat treatment at 300° C. or over to react the implanted hydrogen atoms 6a and 6b with silicon atoms in the substrate 1. At this time, it is necessary to maintain the temperature in the furnace and properly support the substrate 1. If the temperature of the substrate 1 varies, thermal stress will cause strip lines to be formed. Through these processes, the semiconductor wafer of FIG. 1 is produced.

As explained above, the first and second buried insulating films 2a and 2b are formed in the first and second element forming sections 5a and 5b, respectively, at different depths to vary the thickness of the first and second active layers 3a and 3b. On the other hand, the third element forming section 5c is made of the bulk silicon section without a buried insulating film. These configurations enable semiconductor elements of different purposes to be formed on the same substrate 1.

If the substrate 1 includes any other part involving buried insulating films of different depths, masks provided with openings corresponding to the buried insulating films are prepared to properly implant ions into the substrate 1, to form the buried insulating films.

(Second embodiment)

A semiconductor device according to a second embodiment of the present invention will be explained. The semiconductor device is formed from the semiconductor wafer of FIG. 1. According to the second embodiment, the semiconductor device includes semiconductor elements of different purposes formed in the first active layer 3a, second active layer 3b and third active layer 3c, each having different thickness suitable for the elements.

Figure 3:
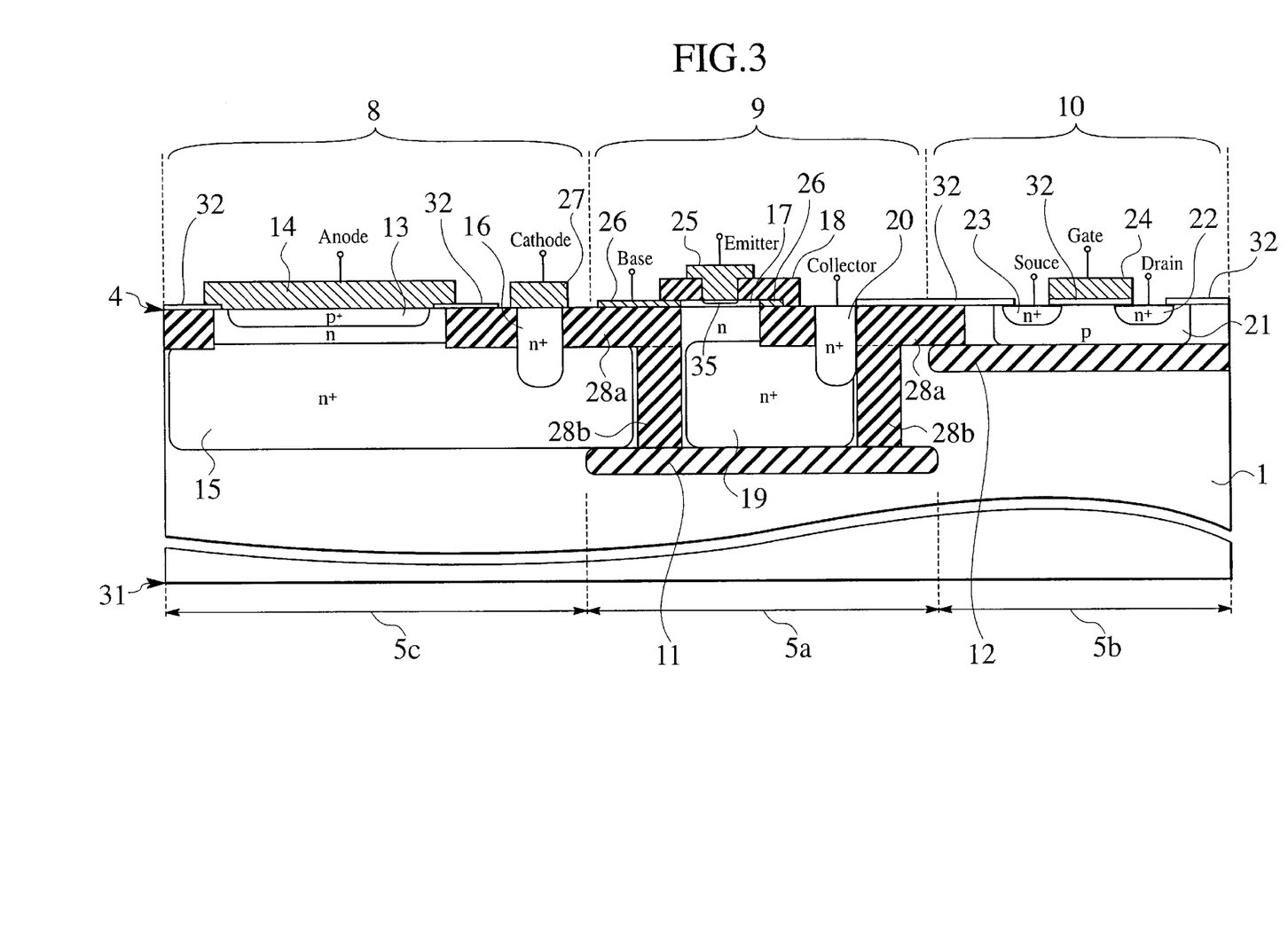
FIG. 3 is a sectional view showing a part of a top surface of a semiconductor wafer where semiconductor elements of a semiconductor device are formed according to a second embodiment of the present invention.
Figure 4:
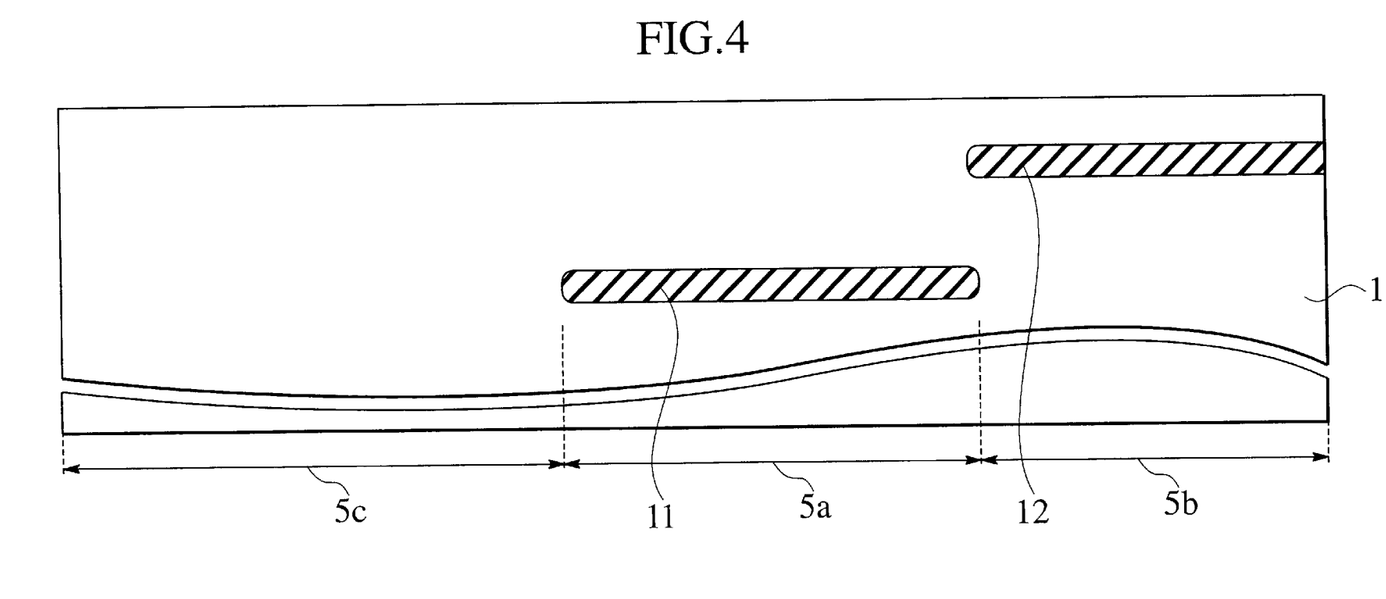
FIGS. 4 to 6 are sectional views corresponding to FIG. 3 and showing a method of manufacturing the semiconductor device of FIG. 3.

In FIG. 3, the semiconductor wafer is made of a semiconductor substrate 1. The substrate 1 has a first element forming section 5a where a first semiconductor element is formed, a second element forming section 5b where a second semiconductor element is formed, and a third element forming section 5c where a third semiconductor element is formed.

The third semiconductor element in the third element forming section 5c has a current path one end of which is at a bottom surface 31 opposing the top surface 4 of the substrate 1. The third semiconductor element may be a power MOSFET, an insulated gate bipolar transistor (IGBT), or a protective diode. In the second embodiment, the third semiconductor element is a protective diode 8. The protective diode 8 allows over current to escape through the bottom surface 31 to outside of the semiconductor device. The substrate 1 is an n-type monocrystalline silicon substrate. The protective diode 8 is, for example, an electro static destruction (ESD) element. The first semiconductor element may be a vertical npn-type bipolar transistor 9. The second semiconductor element may be an n-type MOS transistor 10.

The vertical npn-type bipolar transistor 9 has a thin p$^+$-type base region 17 formed on the flat top surface 4 of the substrate 1, an n$^+$-type emitter region 35 formed at the top surface of and in the base region 17, an n$^+$-type buried collector region 19 formed under the base region 17, and an n$^+$-type lead (sinker) region 20 formed on the buried collector region 19. The potential of the buried collector region 19 is guided to the flat top surface 4 of the substrate 1 through the n$^+$-type lead region 20. A side of the base region 17 is connected to a base electrode 26. The top surface of the emitter region 35 is connected to an emitter electrode 25. The emitter electrode 25 is insulated from the base region 17 and the base electrode 26 by an insulating film 18.

Under the buried collector region 19, there is a first buried insulating film 11. The vertical npn-type bipolar transistor 9 is surrounded with element isolation films 28a and 28b. The element isolation film 28b is buried in a relatively deep trench, and the element isolation film 28a is buried in a relatively shallow trench. The bottom of the isolation film 28b reaches the first buried insulating film 11.

The buried collector region 19 may have a thickness of about 1 to 5 μm, the n$^+$-type lead region 20 may have a thickness of about 0.7 μm, the shallow trench may have a depth of about 0.5 μm, and the deep trench may have a depth of about 5 μm. Namely, the first buried insulating film 11 is buried at a depth of about 5 μm.

In FIG. 3, the element isolation film 28b is in contact with the first buried insulating film 11. Between the element isolation film 28b and the first buried insulating film 11, a channel inversion preventive diffusion region may be formed. Instead of the element isolation film 28b, a p-type region may be formed. In this case, the p-type region forms a p-n junction to isolate the semiconductor elements from one another. Instead of the element isolation film 28a, a LOCOS oxide film may be used.

The n-type MOS transistor 10 is merged in a p-type well region 21 formed at the top surface 4 of and in the substrate 1. The n-type MOS transistor 10 has a source region 23 and a drain region 22 formed at a top surface of and in the well region 21 and a gate electrode 24. The gate electrode 24 is formed on a surface of a gate insulating film 32, between the source and drain regions 23 and 22. The gate insulating film 32 is formed on the flat surface of the substrate 1. Under the well region 21, a second buried insulating film 12 is formed. The p-type well region 21 has a thickness of about 100 nm. Namely, the second buried insulating film 12 is formed at a depth of about 100 nm.

The third element forming section 5c where the protective diode 8 is formed is a bulk silicon section. The protective diode 8 has a p-type anode region 13 formed at the top surface 4 of and in the substrate 1, and an n-type buried cathode region 15 formed under the p-type anode region 13. The potential of the n-type buried cathode region 15 is guided to the top surface 4 of the substrate 1 through an $n^+$-type lead (sinker) region 16. The top surface of the p-type anode region 13 is connected to an anode electrode 14. The top surface of the $n^+$-type lead region 16 is connected to a cathode electrode 27. The third element forming section 5c has the buried cathode region 15. However, the third element forming section 5c has no buried insulating film. The protective diode 8 in the bulk silicon section realizes a high surge immunity.

The protective diode 8 protects the internal circuit of the semiconductor device from an over current. The protective diode 8 is arranged between a transistor input signal and grounding and between a power supply and a signal, to keep a voltage for the internal circuit in the range of zero to a supply voltage. If a signal outside the range is input, the protective diode 8 allows an over current to escape through the substrate 1 to the ground or power supply. By allowing over current to escape through the grounded silicon substrate 1, the protective diode 8 improves surge immunity.

It is, therefore, not preferable to form the protective diode 8 on a SOI structure because a buried insulating film in the SOI structure prevents a flow of over current. It is preferable to form the protective diode 8 in a bulk silicon section.

The element forming sections 5a to 5c of the substrate 1 of FIG. 3 involve the semiconductor elements of different purposes, respectively. The element forming sections 5a to 5c have individual structures appropriate for the semiconductor elements formed therein.

More precisely, the first element forming section 5a contains the vertical npn-type bipolar transistor 9 serving as a high-frequency element. The vertical npn-type bipolar transistor 9 has the buried region 19 in the substrate 1. Accordingly, the first element forming section 5a has a SOI structure having the deep buried insulating film 11. The second element forming section 5b contains the n-type MOS transistor 10, which is a flat element needing no deep active layer. Accordingly, the second element forming section 5b has a SOI structure having the shallow buried insulating film 12. The third element forming section 5c contains the protective diode 8 for passing an over current to the substrate 1. The third element forming section 5c, therefore, has a bulk silicon structure having no buried insulating film.

A method of manufacturing the semiconductor device of FIG. 3 will be explained.

(1) The manufacturing method of FIGS. 2A and 2B is employed to form the semiconductor wafer of FIG. 1. Namely, a monocrystalline silicon rod is produced. The rod is subjected to slicing, lapping, polishing, and defect inspecting processes, to provide the semiconductor wafer made of a semiconductor substrate 1.

(2) A first ion-implantation mask is formed on the substrate 1. The first ion-implantation mask has a first opening defining a first element forming section 5a of the substrate 1. The first ion-implantation mask serves as an ion-implantation protection film when oxygen ions are implanted into the substrate 1. The first ion-implantation mask may be made of a photoresist film, an amorphous silicon film, an insulating film, or a metal film. The same is applicable to a second ion-implantation mask, to be explained later.

(3) The first ion-implantation mask is used to selectively implant oxygen ions through the first opening into the first element forming section 5a with a first projected range from a top surface 4 of the substrate 1. After the completion of ion implantation, the first ion-implantation mask is removed.

(4) The second ion-implantation mask is formed on the substrate 1. The second ion-implantation mask has a second opening defining a second element forming section 5b.

(5) The second ion-implantation mask is used to selectively implant oxygen ions through the second opening in the second element forming section 5b with a second projected range from the top surface of the substrate 1. The second projected range is shorter than the first projected range. After the completion of the ion implantation, the second ion-implantation mask is removed.

(6) The substrate 1 is heat-treated at 1300° C. or over to react the implanted oxygen atoms with silicon atoms, so as to form a first buried insulating film 11 under the first element forming section 5a and a second buried insulating film 12 under the second element forming section 5b, respectively.

Figure 5:
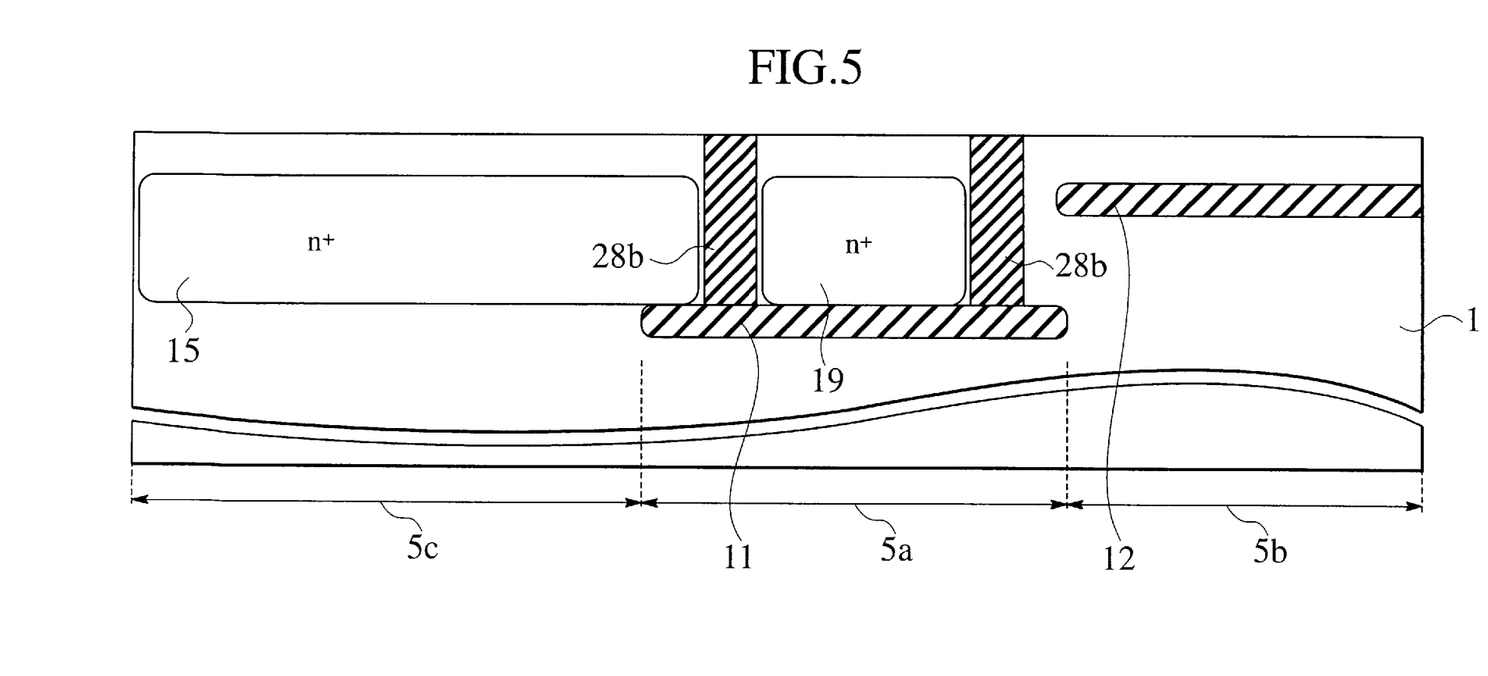

(7) In FIG. 5, a deep trench is formed in the substrate 1, and an insulator is embedded in the deep trench to form a buried isolation film 28b. n-type impurity ions are selectively implanted in the first and third element forming sections 5a and 5c and are activated to form a buried collector region 19 and a buried cathode region 15 in the substrate 1.

Figure 6:
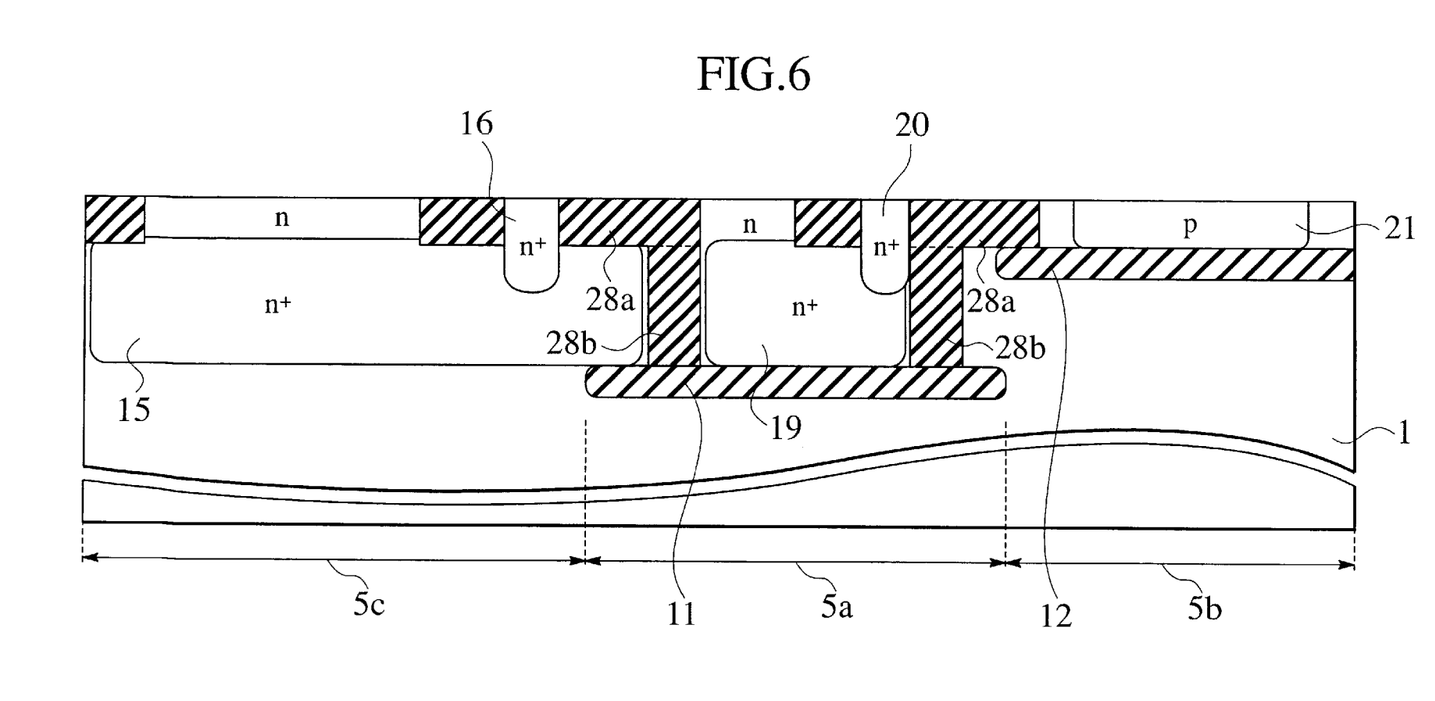

(8) In FIG. 6, a shallow trench is formed in the substrate 1, and an insulator is embedded in the shallow trench to form a buried isolation film 28a. n-type impurity ions are selectively implanted in the first and third element forming sections 6a and 5c and are activated to form $n^+$-type lead regions 20 and 16. p-type impurity ions are selectively implanted in the second element forming section 5b and are activated to form a well region 21.

(9) Turning back to FIG. 3, n-type impurity ions are selectively implanted in the second element forming region 5b and are activated to form a source region 23 and a drain region 22. p-type impurity ions are selectively implanted in the third element forming region 5c and are activated to form an anode region 13 at the top surface 4 of and in the substrate 1. A p-type base region 17 is epitaxially grown in the first element forming section 5a. The base region 17 is selectively grown at top surface 4 of substrate 1.

(10) A base electrode 26 is formed. More precisely, a low-resistivity polysilicon film is formed by CVD. The polysilicon film is selectively removed by photolithography and anisotropic etching, to form the base electrode 26. an insulating film 18 is formed on the base region 17 and the base electrode 26. A resist pattern, having a window corresponding to a emitter electrode 25 to be connected to the base region 17, is formed. The resist pattern is used to carry out anisotropic etching to selectively remove the insulating film 18 at parts corresponding to the emitter electrode 25. The anisotropic etching forms contact holes to expose a part of the base electrode 17.

(11) Lastly, the emitter electrode 25, a gate electrode 24, an anode electrode 14 and a cathode electrode 27 are formed. More precisely, a low-resistivity polysilicon film is formed by CVD. The polysilicon film is selectively removed by photolithography and anisotropic etching, to form the electrodes 25, 24, 14 and 27. n-type impurities are doped to the emitter electrode 25. The n-type impurities are diffused into the p-type base region 17 from the emitter electrode 25, to form an emitter region 35 in the p-type base region 17.

In this way, the manufacturing method of FIGS. 2A and 2B is used to form the first and second insulating layers 11 and 12 having different depths and the active layers having different thickness in the first and second element forming sections 5a and 5b. On the active layers 5a to 5c, the transistors are formed to provide the semiconductor device of FIG. 3.

As explained above, second embodiment forms semiconductor elements of different purposes in substrate sections having proper structures for the semiconductor elements. Namely, second embodiment is capable of forming semiconductor elements of different purposes on the same silicon substrate.

(Modification of second embodiment)

In FIG. 3, the first and second buried insulating films 11 and 12 are formed only in the respective first and second element forming sections 5a and 5b. Namely, the first and second buried insulating films 11 and 12 do not protrude into the adjacent sections. That is, the first and second buried insulating films 11 and 12 do not overlap each other when viewed from the top surface 4 of the substrate 1. In actual semiconductor wafer manufacturing, semiconductor wafers are sometimes provided with no mask alignment marks. In this case, the selective ion implantation processes of FIGS. 2A and 2B must be carried out without the mask alignment marks. To cope with this, a modification of the second embodiment at least partly overlaps the first and second buried insulating films 11 and 12.

Figure 7:
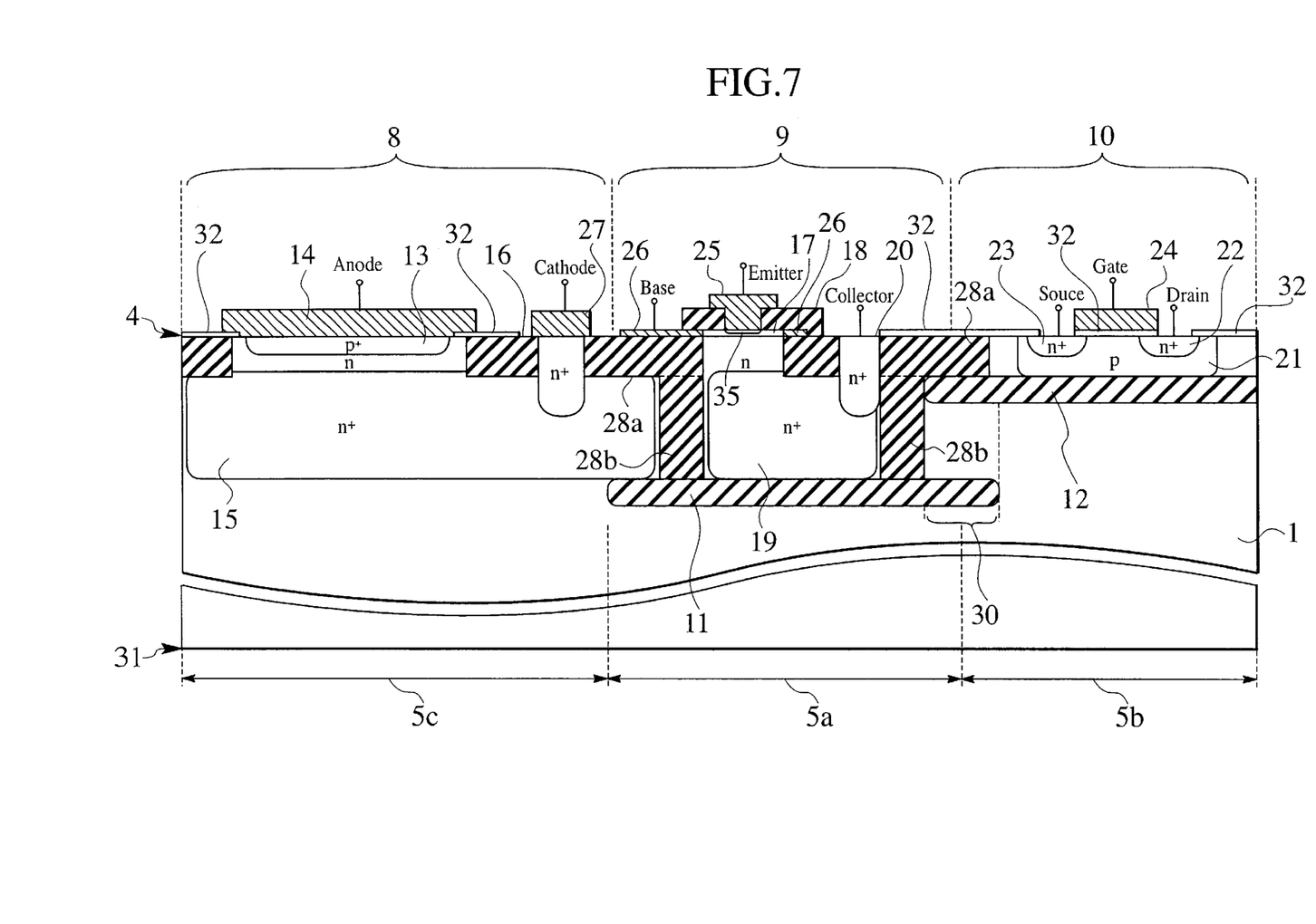
FIG. 7 is a sectional view showing a part of a top surface of a semiconductor wafer where semiconductor elements of a semiconductor device are formed according to a modification of the second embodiment.

In FIG. 7, the semiconductor device has a vertical npn-type bipolar transistor 9 merged in a first element forming section 5a, an n-type MOS transistor 10 merged in a second element forming section 5b, and a protective diode 8 merged in a third element forming section 5c. The semiconductor elements 8 to 10 are the same as those of FIG. 3, and therefore, are not explained in detail.

The first element forming section 5a has a first buried insulating film 11 that partly protrudes into the second element forming section 5b. The second element forming section 5b has a second buried insulating film 12 that partly protrudes into the first element forming section 5a. When viewed from a direction of depth of the buried insulating films 5a and 5b, the first and second buried insulating films 11 and 12 overlap each other. The first and second buried insulating films 11 and 12 form an overlapping area 30 at the boundary between the first and second element forming sections 5a and 5b.

According to a method of manufacturing the semiconductor device of FIG. 7, first and second openings partly overlap each other when viewed from a direction of the depth of the buried insulating films 5a and 5b.

In this way, the modification makes the adjacent buried insulating films 5a and 5b partly overlap each other in a plan view. The modification provides a sufficient process margin for a mask misalignment that may occur during a selective ion implantation process. This technique is advantageous when selectively implanting ions to form the buried insulating films 11 and 12 in a silicon substrate having no mask aligning marks.

The present invention may be embodied in other specific forms without departing from the spirit or essential characteristics thereof. The embodiments are therefore to be considered in all respects as illustrative and not restrictive, the scope of the present invention being indicated by the appended claims rather than by the foregoing description, and all changes which come within the meaning and range of equivalency of the claims are therefore intended to be embraced therein.

What is claimed is:

1. A semiconductor device comprising:

a bulk silicon substrate;

first and second buried insulating films partly formed in said bulk silicon substrate;

a first semiconductor element formed on said first buried insulating film;

a second semiconductor element formed on said second buried insulating film; and a third semiconductor element having a current path one end of which is a bottom surface of said bulk silicon substrate, wherein said third semiconductor element is a protective diode.

2. The semiconductor device of claim 1, wherein said first semiconductor element is a bipolar transistor, and said second semiconductor element is a MOS transistor.

3. The semiconductor device of claim 1, wherein said protective diode includes:

an anode region of a first conductivity type formed at a top surface of and in said bulk silicon substrate; and cathode region of a second conductivity type formed under said anode region.

4. The semiconductor device of claim 2:

said bipolar transistor includes a base region of a first conductivity type formed on a top surface of said bulk silicon substrate, an emitter region of a second conductivity type formed on a surface of said base region, and a buried collector lead region of the second conductivity type formed at a lower part of said bulk silicon substrate; and said MOS transistor includes a well region of the first conductivity type formed at a top surface of and in said bulk silicon substrate, source and drain regions of the second conductivity type formed at a top surface of and in said well region, and a gate electrode formed between said source and drain regions above said bulk silicon substrate.

5. A semiconductor device comprising:

a bulk silicon substrate;

first and second buried insulating films partly formed in said bulk silicon substrate;

a first semiconductor element formed on said first buried insulating film; and a second semiconductor element formed on said second buried insulating film, wherein said first and second buried insulating films partly overlap each other when viewed from a direction of said thickness, wherein said third semiconductor element has a current path one end of which is a bottom surface of said bulk silicon substrate, and wherein said third semiconductor element is a protective diode bulk silicon substrate.

6. The semiconductor device of claim 5, wherein said first semiconductor element is a bipolar transistor, and said second semiconductor element is a MOS transistor.

7. The semiconductor device of claim 5, wherein said protective diode includes:

an anode region of a first conductivity type formed at a top surface of and in said bulk silicon substrate; and a buried cathode region of a second conductivity type formed under said anode region.

8. The semiconductor device of claim 7, wherein:

said bipolar transistor includes a base region of a first conductivity type formed on a top surface of said bulk silicon substrate, an emitter region of a second conductivity type formed on a surface of said base region, and a buried collector lead region of the second conductivity type formed at a lower part of said bulk silicon substrate; and said MOS transistor includes a well region of the first conductivity type formed at a top surface of and in said bulk silicon substrate, source and drain regions of the second conductivity type formed at a top surface of and in said well region, and a gate electrode formed between said source and drain regions above said bulk silicon substrate.

* * * * *